Sept. 28, 1965 J. H. DE WITT, JR 3,209,164
TRANSISTOR AMPLIFIER WITH MULTIPLE OUTPUTS
Filed Oct. 3, 1961
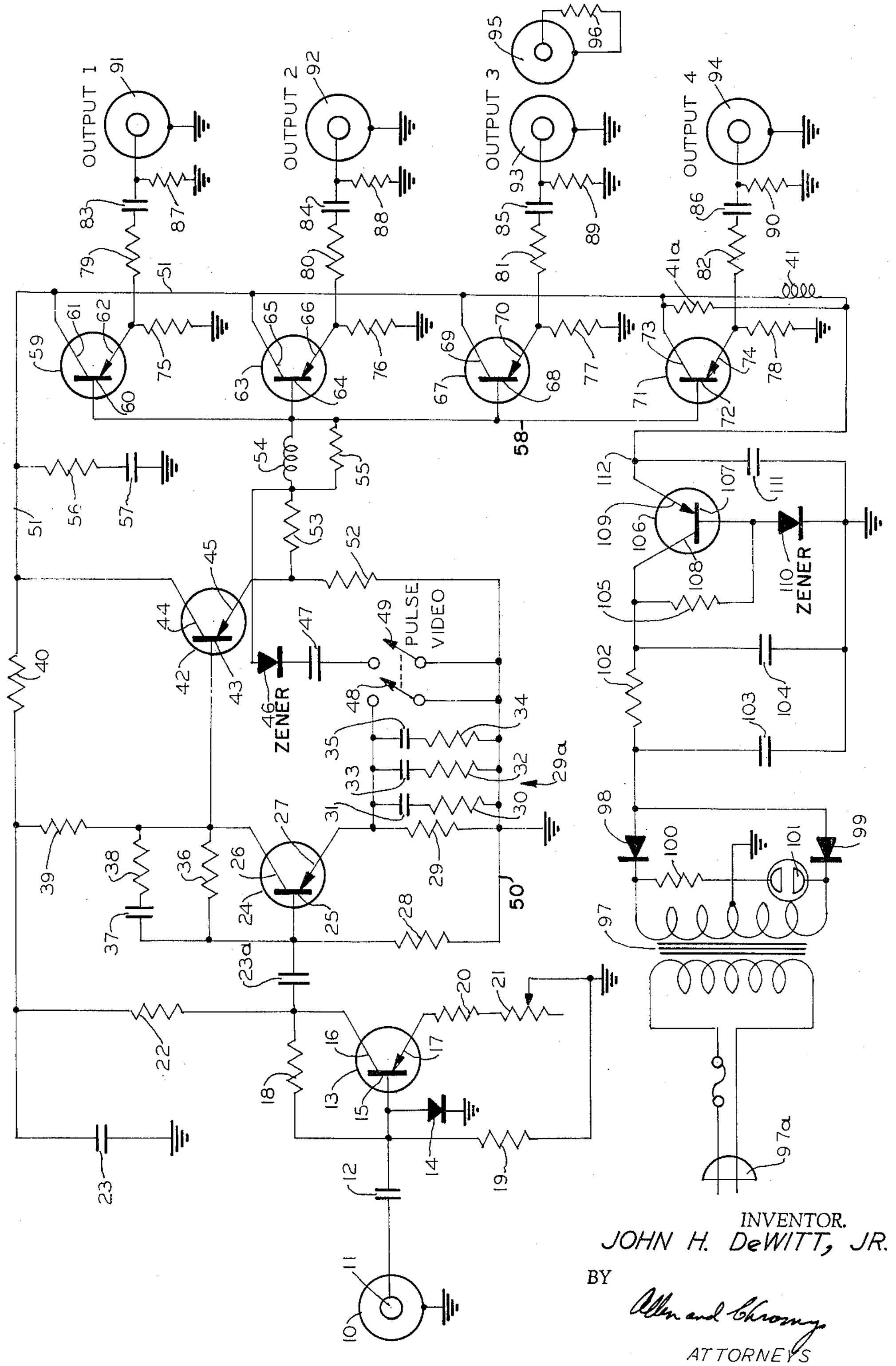
INVENTOR.
JOHN H. DeWITT, JR.
BY
Allen and Chromy
ATTORNEYS 3,209,164
Patented Sept. 28, 1965

3,209,164

TRANSISTOR AMPLIFIER WITH MULTIPLE OUTPUTS

John H. De Witt, Jr., 3602 Hoods Hill Road, Nashville, Tenn.

Filed Oct. 3, 1961, Ser. No. 142,543
4 Claims. (Cl. 307—88.5)

This invention relates to a transistor amplifier adapted to amplify signals over a wide band of frequencies and supply the amplified signals to a plurality of outputs.

An object of this invention is to provide an improved amplifier for amplifying of video and pulse signals to be distributed to a pluarlity of outputs which may be located around the television studio premises.

Another object of this invention is to provide an improved transistor amplifier for selectively amplifying video or pulse signals and supplying the amplified signals to a plurality of outputs.

Another object of this invention is to provide an improved wide band amplifier for the amplification of video and pulse signals selectively and supplying of these signals to a plurality of outputs at different signal levels.

Still another object of this invention is to provide an improved transistor amplifier of video and pulse signals, said amplifier being provided with means to improve the low frequency response thereof.

Still another object of this invention is to provide an improved amplifier for video and pulse signals, said amplifier being constructed to provide substantially uniform amplification over a wide frequency range, for example from 10 cycles to 10 megacycles per second.

A further object of this invention is to provide an improved transistor amplifier which is provided with compensation for the gradual decrease in gain of the transistors in the frequency range from, for example, one-half megacycle to 10 megacycles.

Still a further object of this invention is to provide an improved transistor amplifier for amplifying pulses, said amplifier being provided with a zener diode for clipping and squaring the tops and bottoms of the pulses.

Still another object of this invention is to provide an improved transistor amplifier adapted to amplify signals over a wide range of frequencies and supply the amplified signals to a plurality of outputs which are isolated from each other, such that a short circuit or spurious signals on one of the outputs will produce no observable deleterious effect on the video signal or picture reproduced from the other outputs.

Other and further objects of this invention will be apparent to those skilled in the art to which it relates from the following specifications, claims and drawing.

In accordance with this invention, there is provided an improved transistor type amplifier that is adapted for use especially for the amplification of video and pulse signals to be distributed around the television studio premises at a plurality of outputs each of which may comprise, for example, a 75-ohm coaxial line connected between the different television apparatus and the output of this amplifier. This amplifier is constructed to cover a very wide band of frequencies, that is from about 10 cycles per second to 10 megacycles per second. Suitable degeneration is provided at low frequencies to improve the low frequency response of the amplifier and in addition a specially constructed network is provided in a degenerative connection in one of the transistor stages so that the amplifier frequency characteristics are compensated from around one-half megacycle to 10 megacycles whereby the overall frequency characteristic over the aforesaid wide band is greatly improved.

In the application of this amplifier in the television studio it was found desirable to provide a feature whereby the amplifier may be employed for amplifying video signals and supplying these signals at a certain level to a plurality of outputs, or whereby the amplifier may be used for amplification of pulses and supplying these pulses at a different level likewise to a plurality of outputs. This feature of the invention was taken care of by providing a simple switch arrangement for cutting out part of the degenerative circuit components and connecting into the amplifier circuit a zener diode which functions to clip the tops and bottoms of the pulses thereby limiting the pulses to a certain definite voltage peak to peak which squared pulses are then supplied to the plurality of outputs of the amplifier.

The plural outputs of the amplifier are connected to separate emitter follower resistor capacitor networks which are proportioned with respect to the impedances of the output cables so that substantially complete isolation exists between one output cable and any of the other of the output cables. Thus in the amplification of video signals by this amplifier the operator can connect a monitor to one of the output cables to reproduce the picture while any one of the other outputs is either open or short circuited without producing any observable deleterious effect on the picture reproduced in the monitor.

Further details of this invention will be set forth in the following specification, claims and drawing in which briefly:

The sole figure illustrates a schematic wiring diagram of the amplifier of this invention.

Referring to the drawing in detail there is illustrated a schematic wiring diagram of a multistage, multiple output video and pulse transistor amplifier, the first three stages of which employ transistors 13, 24 and 42 respectively, and the fourth stage of which employs four transistors 59, 63, 67 and 71, that is, one for each output. This amplifier is provided with a co-axial type input connector 10 and four co-axial type output connectors 91–94 in which the outer connector or sheath is grounded to the metal chassis or cabinet structure of the amplifier. The central contact 11 of the coaxial connector 10 is connected to one side of the capacitor 12 and the other side of this capacitor is connected to the base 15 of the transistor 13 and also to the anode of the diode rectifier 14. The cathode of rectifier 14 is grounded to the chassis of the amplifier.

Transistor 13 is also provided with a collector 16 which is connected to the right hand terminal of the resistor 18, to the lower terminal of resistor 22 and to the left hand terminal of the coupling capacitor 23*a*. The left hand terminal of resistor 18 and the upper terminal of resistor 19 are also connected to the base 15 of transistor 13. The upper terminal of resistor 20 connected to the emitter 17 of transistor 13 and the lower terminal of this resistor is connected to the upper terminal of the variable degenerative control resistor 21. The variable contact of resistor 21 and the lower terminal of resistor 19 are connected to ground, that is to the chassis of the amplifier.

The right hand terminal of capacitor 23*a* is connected to the base 25 of transistor 24. This transistor is also provided with a collector 26 and an emitter 27. The right hand terminals of resistors 36 and 38 and the lower terminal of resistor 39 are connected to the collector 26 of transistor 24 and to the base 43 of transistor 42. The left hand terminal of resistor 38 is connected to the right hand side of capacitor 37 and the left hand side of this capacitor is connected to the left hand terminal of resistor 36 and to the base 25 of transistor 24. Resistor 38 and capacitor 37 form an equalizer to improve the low frequency response of the amplifier by decreasing the degeneration at low frequencies. The upper terminal of resistor 28 is also connected to the base 25 of transistor 24 and its lower terminal is connected to ground, that it, to the amplifier chassis. Resistor-capacitor network 29a which is used to compensate for the gradual decrease in gain in the amplifier at high frequencies is connected between the emitter 27 of transistor 24 and ground. This network includes resistor 29 which is shunted by three branches of series connected resistors and capacitors each branch having a different time constant. The first branch consists of series connected resistor 30 and capacitor 31; the second branch consists of the resistor 32 and the capacitor 33 connected in series; and the third branch consists of the resistor 34 and the capacitor 35 which are also connected in series. The purpose of this network will be described more fully hereinafter.

Transistor 42 also is provided with a base 43, a collector 44 and an emitter 45. Collector 44 of this transistor is connected directly to the supply line 51 which is connected to the rectifier as will be described hereinafter for the purpose of supplying a negative potential to the collector 44 of transistor 42 as well as the collectors 61, 65, 69 and 73 of transistors 59, 63, 67 and 71 respectively. The inputs of transistors 59, 63, 67 and 71 are connected in parallel and the outputs thereof supply signals separately to the output circuits of this amplifier. Supply line 51 also supplies the desired potentials to the collectors 16 and 26 of transistors 13 and 24 respectively and in this instance a resistor 40 is interposed in the line 51. In addition, resistors 22 and 39 are connected between the collectors 16 and 26 respectively and the supply line 51. A capacitor 23 is also connected between this portion of the supply line 51 and ground as shown. In addition resistor 56 and capacitor 57 which are connected in series are interposed between the line 51 and ground, also as shown.

The emitter 45 of transistor 42 is connected to the upper end of resistor 52 and to the left hand end of resistor 53 and the right hand end of resistor 53 is connected to the left hand terminals of resistor 55 and choke coil 54. The right hand terminals of elements 54 and 55 are connected to the line 58 which is connected to the bases 60, 64, 68 and 72 of transistors 59, 63, 67 and 71 respectively. Thus transistor 42 is connected as an emitter follower type amplifier stage and supplies signals to the bases of transistors 59, 63, 67 and 71 through the resistor and choke coil network including resistors 53 and 55 and choke coil 54. The common point between these resistors and choke coil is connected to the anode of the zener diode 46 and the cathode of this zener diode is connected to the upper terminal of capacitor 47. The lower terminal of this capacitor is connected to the contact of switch 49, the switch blade of which is connected to ground. Another switch 48 which is mechanically coupled to switch 49 to be operable simultaneously therewith is provided with a switch blade which is also connected to ground and the contactor of this switch 48 is connected to the upper terminals of capacitors 31, 33, 35 and to the upper terminal of resistor 29 as well as to the emitter 27 of transistor 24. When switch 48 is in the open position, the emitter 27 of transistor 24 is coupled to the grounded line 50 through the network 29a and the amplifier is connected for amplifying video signals over a very wide frequency range as will be described hereinafter. However, when the switch 48 is closed, the emitter 27 of transistor 24 is connected directly to the ground line 50 through this switch. Also, when switch 49 is closed the zener diode 46 and capacitor 47 are connected in series between the common point of resistors 53 and 55 and choke coil 54 and the ground line 50 so that this zener diode acts as a pulse clipping device when this amplifier is employed as a pulse amplifier.

The output transistors 59, 63, 67 and 71 supplying the output branch circuits are each connected as emitter followers and resistors 75, 76, 77 and 78 are connected between the emitters 62, 66, 70 and 74 respectively thereof and ground. The upper terminals of these resistors in addition to being connected to the aforesaid emitters are connected to the left hand terminals of resistors 79, 80, 81 and 82 respectively and the right hand terminals of these resistors are connected to the left sides of capacitors 83, 84, 85 and 86 respectively. The right hand sides of capacitors 83, 84, 85 and 86 are connected to the upper terminals of resistors 87, 88, 89 and 90 respectively and to the center terminals of the coaxial connectors 91, 92, 93 and 94 respectively. The sheaths of these coaxial connectors are connected to ground. Suitable connectors such as connector 95 adapted to fit into the coaxial connectors 91, 92, 93 and 95, are provided for connecting the load circuits to these branch outputs. The load circuits may comprise suitable coaxial cables or lines the input ends of which are provided with suitable connectors adapted to fit into the connectors 91, 92, 93 and 94 and the output ends of these cables or lines are connected to various pieces of equipment which utilize the amplified signals.

This amplifier is also provided with a suitable source of rectified current supply the output voltage of which is regulated and the input of which is adapted to be connected to an ordinary wall current outlet to which the plug 97a may be connected. This source of current supply includes a transformer 97 having a primary connected to the terminals of the plug 97a and also having a secondary the center tap of which is connected to ground, that is, to the amplifier chassis through which it is connected to all of the grounded points previously referred to the description of the amplifier and this ground point forms the positive terminal of the rectified current supply suorce. A pilot lamp 101, which may be of the gas discharge type, is connected in series with a resistor 100 across the end terminals of the secondary winding of transformer 97. The end terminals of the secondary winding are also connected to the respective cathodes of diode rectifiers 98 and 99 and the anodes of these rectifiers are connected together and to the upper terminal of capacitor 103 and left hand terminal of resistor 102. The right hand side of resistor 102 is connected to the upper terminal of capacitor 104, the upper terminal of resistor 105 and to the collector 108 of transistor 106 which together with the zener diode 110 functions as a regulator for this power supply. The bottom terminal of resistor 105 and the base 107 of transistor 106 are connected to the anode of zener diode 110. The emitter 109 of transistor 106 is connected to the terminal 112 which is connected to line 51 through resistor 41a and choke coil 41 which are connected in parallel with each other. The lower terminals of capacitors 103, 104 and 111 and the cathode of zener diode 110 are all connected to ground.

This amplifier was constructed to take video signals at a level of about 0.25 volt or more and deliver to each of the four outputs a signal of 1 volt or more peak to peak. It is however to be understood that this amplifier may be used to amplify other signals of other voltages and that different numbers of outputs other than four may be employed within the signal handling capacity of the amplifier. These composite video signals are distributed to monitors, switchers and other apparatus around the television studio premises through coaxial lines which may be for example the conventional 75-ohm coaxial lines.

The first two stages of this amplifier employing the transistors 13 and 24 are both provided with degeneration by providing resistors 18 and 36 respectively between the bases and collectors of these transistors in order to stabilize the operating points thereof. In addition, resistors 20 and 21 provide degeneration in the circuit of transistor 13 and resistor 21 is made variable, thereby permitting the operator to change the gain of the amplifier through changing its degeneration by controlling the value of this resistor. Resistor 29 which also introduces degeneration is provided to transistor 24. In this transistor the series combination of resistor 38 and capacitor 37 is connected between the base and collector for the purpose of improving the low frequency response of the amplifier by decreasing the degeneration at low frequencies.

This amplifier was constructed to cover a very wide band of frequencies, that is, from 10 cycles per second to 10 megacycles per second. Inasmuch as transistors generally show a gradually diminishing gain with frequency it is necessary in a wide band amplifier to compensate for such decrease in gain toward the high frequency end of the band. For this purpose the resistor-capacitor network **29*a* is connected between the emitter 27 of transistor 24 and the ground line 50** and this network provides the desired compensation for the gradual decrease in gain of the transistors over a wide frequency band.

Three resistor-capacitor combinations are employed in this network and each of these three resistor-capacitor combinations provides compensation for the gradual decrease in gain of the transistors over a certain frequency band. Thus where one combination gradually leaves off in the frequency band another of these combinations gradually takes over so that satisfactory compensation is obtained over this wide frequency band. Where transistors of the 2N1143 type are employed, it has been found that the following values for these resistors and capacitors are satisfactory for the desired compensation: resistor 29 equal to 47 ohms, resistor 30, equal to 3,300 ohms, resistor 32 equal to 1,500 ohms, and resistor 34 equal to 470 ohms; capacitor 31 equal to 0.03 mf., capacitor 33 equal to 0.003 mf., and capacitor 35 equal to 150 mmf. These values are given for purposes of illustration only and of course are not intended to limit this invention thereto as other values may be found to be satisfactory. Other types of transistors also may be employed satisfactorily.

When this amplifier is to be employed for amplifying video signals, the switches 48 and 49 are left open as previously described so that the network **29*a* is connected between the emitter 27 of transistor 24 and the ground line 50. However, when the amplifier is to be employed for amplification of pulses, such as are to be delivered from the synchronizing generators to the television cameras and camera control units, etc., at a level of, for example, four volts peak to peak, the switches 48 and 49 are closed so that the network 29*a* is shorted out of circuit and the zener diode 46 is connected into the output circuit of the emitter follower transistor 42. In the pulse position the amplifier functions to amplify negative synchronizing, blanking or driving pulses supplied to its input and these pulses are clipped top and bottom and delivered to the four different output branches which are connected, for example, to 75-ohm coaxial cables. The purpose of the zener diode 46** is to clip the top and bottom of these pulses.

The gain of this amplifier is adjusted such that if two volts or more peak to peak is provided at the input of the amplifier, the zener diode 46 will conduct on both the negative and positive ends of the pulses. Thus in this case, where it is desired to provide pulses of approximately eight volts peak to peak across the emitter follower resistors 75, 76, 77 and 78 of the output stages, the zener diode 46 is chosen so that its forward and backward conducting limits are about 8.2 volts apart.

A capacitor 47 is connected in series with the zener diode 46 and this capacitor functions to build up a reverse bias potential which exactly matches the D.C. voltage present between the bases 60, 64, 68 and 72 of transistors 59, 63, 67 and 71 respectively with respect to ground. The zener diode 46 then functions to clip the pulses and form them so that they have square tops and bottoms.

The output branches of this amplifier are constructed to feed a plurality of loads. These branches are isolated from each other and this has been achieved in this amplifier as follows: First of all we have four output stages, one to drive each one of the four outputs. The output stages are emitter followers and the output impedance between the emitter and ground of a stage like this is the impedance between the base and ground divided by the current gain. Since the driver impedance is quite low the output impedance is lower still and the impedance between the emitter and ground is only on the order of one ohm. This in itself provides a considerable amount of isolation between the various outputs and if a spurious signal were to come back into the amplifier through one of the outputs, it would encounter first the resistor 79 which is of the order of 75 ohms, for example, and then would go into the emitter to ground path of the output transistor 59. The signal then would be divided in the ratio of about 1 to 76. In addition to this, the output stage is driven by a similar stage the emitter follower transistor 42. This stage has a low output impedance so that any current change which takes place at the emitter of one of the output transistors 59, 63, 67 and 71 is reduced in a rather large ratio first at the base thereof. In encountering the low driving impedance from the output of transistor 42 very little voltage change can take place so that there exists isolation between outputs 91–94 of the order of 50 db. As a matter of fact in actual use of this amplifier, when it is in the video position and is transmitting a television picture to the outputs thereof, a monitor connected to one of the outputs will reproduce the picture with no observable effect on the picture even when any one of the other outputs is opened or short circuited.

While I have shown a preferred embodiment of the invention, it will be understood that the invention is capable of variation and modification from the form shown so that its scope should be limited only by the scope of the claims appended hereto.

What I claim is:

1. A transistor amplifier adapted to be used for amplifying signals having a wide range of frequencies and supplying the amplified signals to an output having a plurality of branches comprising the combination of a first transistor having an input circuit and an output circuit, degenerative feedback means connected between said input circuit and said output circuit, said degenerative feedback means including means for reducing the degenerative feedback slightly at low frequencies, an electrical network connected to said transistor to compensate for the gradual decrease in gain in said transistor toward the high frequency end of the amplified spectrum, a second transistor having an input circuit connected to the output circuit of said first transistor, a zener diode connected to the output circuit of said second transistor for limiting the amplitude of signal pulses amplified by said second transistor, means for connecting or disconnecting said zener diode to or from said second transistor, switch means including means connected to disable said electrical network when said zener diode is connected into the output circuit of said second transistor, a plurality of output branches connected to the output circuit of said second transistor, each of said output branches having a line of predetermined impedance connected thereto, and impedance means connected to each of said branches for substantially matching the impedance of the line connected thereto.

2. A transistor amplifier adapted to be used for amplifying signals having a wide range of frequencies and supplying the amplified signals to an output having a plurality of branches comprising the combination of a first transistor having an input circuit and an output circuit, degenerative feedback means connected between said input circuit and said output circuit, said degenerative feedback means including means for reducing the degenerative feedback slightly at low frequencies, an electrical network connected to said transistor to compensate for the gradual decrease in gain in said transistor toward the high frequency end of the amplified spectrum during amplification of video signals covering a wide frequency band, a second transistor having an output circuit connected to the output circuit of said first transistor, means including a zener diode for limiting the amplitude of voltage pulses amplified by said second transistor during amplification of such pulses, switch means connected to disable said electrical network when said zener diode is connected to said second second transistor during amplification of said pulses, a plurality of output branches connected to the output circuit of said second transistor, each of said output branches having a line of predetermined impedance connected thereto, and impedance means connected to each of said branches for substantially matching the impedance of the line connected thereto.

3. A transistor amplifier adapted to be used for amplifying signals having a wide range of frequencies and supplying the amplified signals to an output having a plurality of branches which are electrically terminated so that the load conditions of the different circuits connected to the different branches are not reflected into said output circuit comprising a first transistor having an input circuit and an output circuit, degenerative feedback means connected between said input circuit and said output circuit, said degenerative feedback means including means for reducing the degenerative feedback slightly at low frequencies, an electrical network connected to said transistor to compensate for the gradual decrease in gain in said transistor toward the high frequency end of the amplified spectrum, said electrical network comprising a plurality of branches each effecting said compensation over a substantially different band of frequencies, a second transistor having an input circuit connected to the output circuit of said first transistor, a zener diode connected to the output circuit of said second transistor for limiting the amplitude of voltage pulses amplified by said second transistor, switch means connected in series with said zener diode, said switch means including means connected to disable said electrical network when said zener diode is connected into the output circuit of said second transistor, a plurality of output branches connected to the output circuit of said second transistor, each of said output branches having a line of predetermined impedance connected thereto, and impedance means connected to each of said branches for substantially matching the impedance of the line connected thereto.

4. A transistor amplifier adapted to be used for amplifying signals having a wide range of frequencies and supplying the amplified signals to an output having a plurality of branches which are electrically terminated so that the load conditions of the different circuits connected to the different branches are not reflected into said output circuit comprising a first transistor having an input circuit and an output circuit, degenerative feedback means connected between said input circuit and said output circuit, said degenerative feedback means including means for reducing the degenerative feedback slightly at low frequencies, an electrical network connected to said transistor to compensate for the gradual decrease in gain in said transistor toward the high frequency end of the amplified spectrum, a second transistor having an input circuit connected to the output circuit of said first transistor, a zener diode connected to the output circuit of said second transistor for limiting the amplitude of voltage pulses amplified by said second transistor, switch means connected in series with said zener diode, said switch means including means connected to disable said electrical network when said zener diode is connected into the output circuit of said second transistor, a plurality of output branches connected to the output circuit of said second transistor, each of said output branches being connected to said second transistor by an output transistor which is connected as an emitter follower, each of said output branches having a line of predetermined impedance connected thereto, and impedance means connected to each of said emitter follower output transistors for substantially matching the impedance of the line connected thereto.

References Cited by the Examiner

UNITED STATES PATENTS

| | | | |
|---|---|---|---|
| 2,101,688 | 12/37 | Rechnitzer | 330—94 |
| 2,229,705 | 6/41 | Rath | 330—94 |
| 2,984,753 | 5/61 | Della Salle | 307—88.5 |
| 2,994,040 | 7/61 | Waldhaver | 330—21 |
| 3,031,623 | 4/62 | Custin et al. | 307—88.5 |
| 3,064,143 | 10/62 | Sanderson | 307—88.5 |
| 3,097,310 | 7/63 | Sevilla | 307—88.5 |

OTHER REFERENCES

"Junction Transistor Electronics," by Hurley, John Wiley and Sons, New York, September 1959, page 130.

"Transistor Circuit Engineering," by Shea, John Wiley and Sons, Inc., New York, pages 390–392, May 1958.

DAVID J. GALVIN, *Primary Examiner.*

JOHN W. HUCKERT, ARTHUR GAUSS, *Examiners.*